(12) United States Patent
Li et al.

(10) Patent No.: US 9,620,181 B2
(45) Date of Patent: Apr. 11, 2017

(54) ADAPTIVE GRANULARITY ROW-BUFFER CACHE

(71) Applicant: Hewlett-Packard Development Company, L.P., Houston, TX (US)

(72) Inventors: Sheng Li, Palo Alto, CA (US); Norman Paul Jouppi, Palo Alto, CA (US); Naveen Muralimanohar, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/764,673

(22) PCT Filed: Jan. 31, 2013

(86) PCT No.: PCT/US2013/024179
§ 371 (c)(1),
(2) Date: Jul. 30, 2015

(87) PCT Pub. No.: WO2014/120215
PCT Pub. Date: Aug. 7, 2014

(65) Prior Publication Data
US 2015/0371689 A1 Dec. 24, 2015

(51) Int. Cl.
*G06F 12/00* (2006.01)
*G11C 7/10* (2006.01)
(Continued)

(52) U.S. Cl.
CPC ........ *G11C 7/1072* (2013.01); *G06F 12/0875* (2013.01); *G06F 12/0893* (2013.01);
(Continued)

(58) Field of Classification Search
CPC . G11C 7/1072; G11C 7/1084; G11C 11/4087; G11C 11/4093; G11C 15/00;
(Continued)

(56) References Cited

U.S. PATENT DOCUMENTS 5,055,999 A * 10/1991 Frank .................. G06F 9/30003
711/117
6,363,458 B1 3/2002 Park
(Continued)

FOREIGN PATENT DOCUMENTS

TW 200627174 A 8/2006
TW 200845035 A 11/2008
(Continued)

OTHER PUBLICATIONS

Hidaka, Hideto, et al., "The Cache DRAM Architecture: A DRAM with an On-Chip Cache Memory", 1990, 12 Pages.
(Continued)

*Primary Examiner* — Charles Rones
*Assistant Examiner* — Nanci Wong
(74) *Attorney, Agent, or Firm* — Mannava & Kang, P.C.

(57) ABSTRACT

According to an example, a method for adaptive-granularity row buffer (AG-RB) caching may include determining whether to cache data to a RB cache, and adjusting, by a processor or a memory side logic, an amount of the data to cache to the RB cache for different memory accesses, such as dynamic random-access memory (DRAM) accesses. According to another example, an AG-RB cache apparatus may include a 3D stacked DRAM including a plurality of DRAM dies including one or more DRAM banks, and a logic die including a RB cache. The AG-RB cache apparatus may further include a processor die including a memory controller including a predictor module to determine whether to cache data to the RB cache, and to adjust an amount of the data to cache to the RB cache for different DRAM accesses.

20 Claims, 6 Drawing Sheets

(51) Int. Cl.
*G11C 11/408* (2006.01)
*G11C 11/4093* (2006.01)
*G11C 15/00* (2006.01)
*G06F 12/0893* (2016.01)
*G06F 12/0875* (2016.01)

(52) U.S. Cl.
CPC ........ *G11C 7/1084* (2013.01); *G11C 11/4087* (2013.01); *G11C 11/4093* (2013.01); *G11C 15/00* (2013.01); *G06F 2212/3042* (2013.01); *G06F 2212/452* (2013.01); *Y02B 60/1225* (2013.01)

(58) Field of Classification Search
CPC ............. G06F 12/0875; G06F 12/0893; G06F 2212/3042; G06F 2212/452
See application file for complete search history.

(56) References Cited

U.S. PATENT DOCUMENTS

| | | | |
|---|---|---|---|
| 7,822,911 | B2 | 10/2010 | Resnick |
| 8,151,012 | B2 | 4/2012 | Kim et al. |
| 2002/0013889 | A1 | 1/2002 | Schuster et al. |
| 2003/0097527 | A1* | 5/2003 | Bushey ............... G06F 12/0817 711/119 |
| 2005/0210203 | A1 | 9/2005 | Stenstrom |
| 2007/0192550 | A1 | 8/2007 | Rodeheffer et al. |
| 2008/0133893 | A1* | 6/2008 | Glew ................... G06F 9/3012 712/220 |
| 2011/0107032 | A1 | 5/2011 | Shen et al. |
| 2011/0208919 | A1* | 8/2011 | Pruthi ................ G06F 12/0862 711/137 |
| 2012/0191900 | A1* | 7/2012 | Kunimatsu ........... G06F 3/0679 711/103 |
| 2012/0317376 | A1* | 12/2012 | Loh ..................... G06F 13/1657 711/154 |
| 2013/0238856 | A1* | 9/2013 | Loh ..................... G06F 12/0864 711/118 |
| 2014/0223120 | A1* | 8/2014 | Franceschini ........... G06F 12/16 711/162 |

FOREIGN PATENT DOCUMENTS

| | | |
|---|---|---|
| TW | 200912643 A | 3/2009 |
| TW | 201133487 A1 | 10/2011 |
| TW | 201137613 A1 | 11/2011 |
| TW | 201203099 A1 | 1/2012 |

OTHER PUBLICATIONS

Loh, Gabriel H., "3D-Stacked Memory Architectures for Multi-Core Processors", Georgia Institute of Technology, Jun. 21-25, 2008, 12 Pages.

Loh, Gabriel H., "A Register-file Approach for Row Buffer Caches in Die-stacked DRAMs", AMD Research, Advanced Micro Devices, Inc., 2011, 11 Pages.

Pawlowski, J., "Hybrid Memory Cube (HMC)", Micron, Aug. 4, 2011, 24 Pages.

PCT Search Report/Written Opinion ~ Application No. PCT/US2013/024179 dated Oct. 29, 2013 ~ 10 pages.

Woo, Dong H., et al., "An Optimized 3D•Stacked Memory Architecture by Exploiting Excessive, HighDensity TSV Bandwidth", Georgia Institute of Technology, Jan. 9-14, 2010, 12 Pages.

* cited by examiner

Fig. 6

ADAPTIVE GRANULARITY ROW-BUFFER CACHE

BACKGROUND

A dynamic random-access memory (DRAM) is a type of random-access memory (RAM) that stores each bit of data in a separate capacitor within an integrated circuit (IC). Each capacitor may include two states, such as charged or discharged, that can represent two values of a bit (e.g., 0 and 1). Because of the operational characteristics of a capacitor, the capacitor charge is periodically refreshed to avoid loss of information related to the bit value. The need to periodically refresh the capacitor charge is the basis for designating this type of memory as dynamic. A DRAM can be fabricated in a three-dimensional (3D) stacked structure that combines multiple layers of dense memory die with a base logic layer to implement, for example, peripheral circuitry, interface logic, and test structures.

BRIEF DESCRIPTION OF DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Figure 1A:
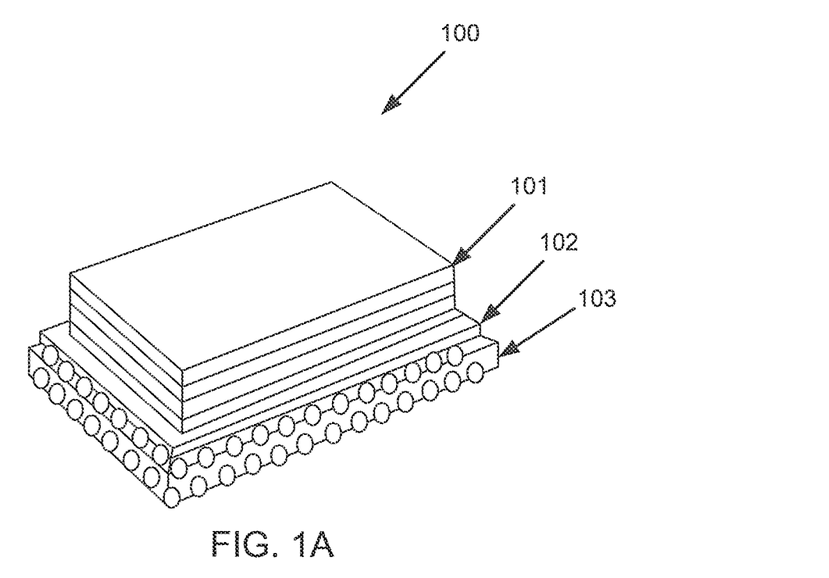
FIG. 1A illustrates an isometric view of a three-dimensional (3D) stacked dynamic random-access memory (DRAM), according to an example of the present disclosure.
Figure 1B:
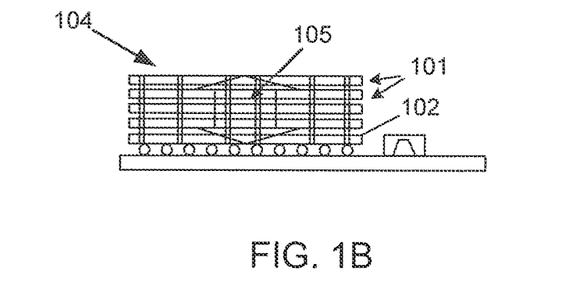
FIG. 1B illustrates a front view of the 3D stacked DRAM of FIG. 1A, according to an example of the present disclosure.

Memory rows in a three-dimensional (3D) stacked dynamic random-access memory (DRAM) may be cached by using a row buffer cache to improve the overall performance of the DRAM. For example, referring to FIGS. 1A and 1B, a 3D stacked DRAM 100 may include multiple layers of dense memory die 101 with a base logic layer 102 and a package substrate layer 103. The 3D stacked DRAM 100 may further include 64-bit wide through silicon via (TSV) channels 104 for transferring data via a data path 105 from a DRAM row from the memory die 101 to the base logic layer 102. A row-buffer cache may be added to the base logic layer 102 to provide faster memory access and improved power efficiency by reducing the number of slow and power-intensive row buffer activations and closings. One method of caching DRAM rows includes caching DRAM rows with a high hit rate (i.e., frequent future memory accesses to the same row). However, for applications with irregular memory access patterns, caching an entire DRAM row can be inefficient. For example, for applications with irregular memory access patterns where memory accesses can access a partial memory row repeatedly, caching an entire DRAM row can be inefficient. One reason for the inefficiency is based on the relatively long DRAM rows that can be 8 Kbit to 16 Kbit long. Moving an entire DRAM row from the memory die 101 to the base logic layer 102 through the 64-bit wide TSV channels 104 uses 64 cycles. Moreover, caching DRAM rows contributes to the dynamic power of row-buffer caches and TSVs, and increases total system power.

According to an example, an adaptive-granularity row buffer cache (hereinafter "AG-RB cache") apparatus and a method for adaptive-granularity row buffer caching (hereinafter "AG-RB caching") are disclosed herein. The apparatus and method disclosed herein generally include an AG-RB caching process that dynamically adjusts the amount of data transferred to the RB cache for different DRAM accesses. The AG-RB caching process improves RB caching performance without significantly increasing TSV bandwidth usage, resulting in low energy consumption. Thus, the apparatus and method disclosed herein maximize the performance and energy benefits of the RB cache on the logic layer of a 3D stacked DRAM. The apparatus and method disclosed herein may include a dedicated predictor module to provide scalability, for example, to many core processors and memory systems with a large number of banks with minimal overhead. The predictor module may decide whether to cache the corresponding DRAM row for an outstanding request, and if so, how much of the DRAM row should be cached. The predictor module not only increases the row buffer hit rate with more accurate predictions, but is also scalable with the memory request queue size based on the increasing number of banks in 3D stacked memories. The apparatus and method disclosed herein further include a RB cache capable of storing lines of different sizes to support the AG caching process. The apparatus and method disclosed herein further include a DRAM-status aware replacement policy to select a best cache replacement candidate to minimize latency when replacing a RB cache entry.

According to an example, the AG-RB cache apparatus may include a 3D stacked DRAM including a plurality of DRAM dies including one or more DRAM banks, and a logic die including a RB cache. The AG-RB cache apparatus may further include a processor die including a memory controller including a predictor module to determine whether to cache data to the RB cache, and to adjust an amount of the data to cache to the RB cache for different DRAM accesses. According to another example, the method for AG-RB caching may include determining whether to cache data to a RB cache, and adjusting, by a processor or a memory side logic, an amount of the data to cache to the RB cache for different memory accesses. The AG-RB cache apparatus and method disclosed herein may be used with other types of memory, such as non-volatile memories including phase-change memory (PCM), spin-transfer torque RAM (STT-RAM), and resistive random-access memory (ReRAM), etc.

The AG-RB cache apparatus and method disclosed herein provide an AG-RB cache to 3D stacked DRAMs, and thus provide an improved performance and energy-efficient memory subsystem for large scale data centers. The apparatus and method disclosed herein provide benefits of performance and energy efficiency for a broad range of applications with different memory behaviors. The apparatus and method disclosed herein decouple the memory controller queue and predictor queue, and provide accurate prediction on memory access patterns, which leads to improved use of a RB cache and improved performance and energy-efficiency. Examples of uses of the apparatus and method disclosed herein may include dual in-line memory modules (DIMMs) with an additional on-board buffer chip.

Figure 2:
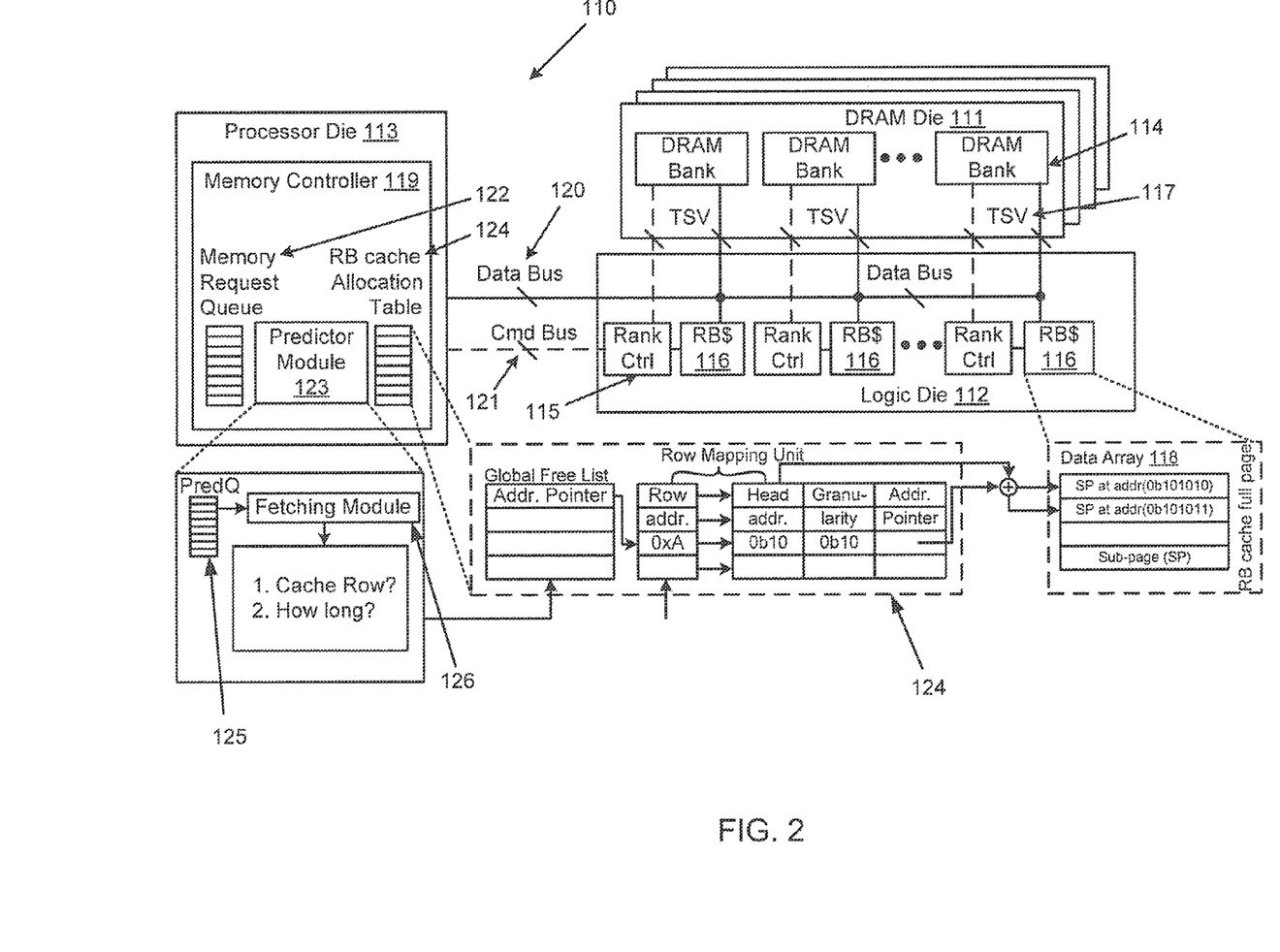
FIG. 2 illustrates an architecture of an adaptive-granularity row buffer cache (AG-RB cache) apparatus, according to an example of the present disclosure.

FIG. 2 illustrates an architecture of an AG-RB cache apparatus 110, according to an example. Referring to FIG. 2, the apparatus 110 is depicted as including a DRAM die 111 illustrating a DRAM layer, a logic die 112 illustrating a logic layer, and a processor die 113 illustrating a processor layer. Various other components of a processor of the processor die 113, such as, a cache, etc., are omitted for clarity. The DRAM die 111 may include a plurality of DRAM banks 114 communicatively connected to rank controllers 115 and RB caches 116 (also illustrated as RB$, and designated as AG RB cache 116) via TSV channels 117. The RB caches 116 may include a data array 118. The DRAM banks 114 and RB caches 116 may be communicatively connected to a memory controller 119 via data bus 120 and command bus 121. The memory controller 119 may store addresses of a variable number of upcoming and previously served memory requests. Each memory rank may own a separate RB cache 116, which is shared by multiple DRAM banks 114 from different DRAM dies 111. The memory controller 119 may include a memory request queue 122, a scalable predictor module 123, and a RB cache allocation table 124. The predictor module 123 may include a predictor queue 125 that is decoupled from the memory request queue 122 and a fetching module 126. The fetching module 126 may use policies to determine whether to cache a DRAM row to the RB cache 116. Although the RB cache allocation table 124 and the data array 118 are shown as being separated in the example of FIG. 2, the RB cache allocation table 124 and the data array 118 may be both provided on the memory side if the memory has a logic die. Alternatively, the RB cache allocation table 124 and the data array 118 may be both provided on the processor side.

The modules and other components of the apparatus 110 that perform various other functions in the apparatus 110, may comprise machine readable instructions stored on a non-transitory computer readable medium. In addition, or alternatively, the modules and other components of the apparatus 110 may comprise hardware or a combination of machine readable instructions and hardware.

With regard to the decoupled predictor queue 125, the prediction of whether to cache data to the AG RB cache 116 as well as what part of a row to cache may be based on information contained in a memory access pattern. For example, a pending memory request queue inside the existing memory request queue 122 of the memory controller 119 may be leveraged for analysis of a memory access pattern. While this approach may be used for memories with a limited number of banks per channel (e.g., 16 banks), this approach is generally not scalable to meet the demands of 3D DRAMs that may contain hundreds of banks per channel. For example, a large bank count (e.g., for the DRAM banks 114) can lead to high bank-level parallelism, and therefore reduce the number of queued-up pending memory requests per bank. As a result, because of the insufficient access pattern information in the pending memory request queue, the accuracy of the RB cache data caching can be reduced. Moreover, the existing pending memory request queue 122 may typically include limited capacity. The reason is that increasing the memory request size can be expensive as the pending memory request queue is a complex and power-intensive content addressable memory (CAM) structure that holds memory access information, such as, addresses, data, and control.

The decoupled predictor queue 125 addresses scalability demand and issues related to reduced memory access pattern information and large overhead of a long pending memory request queue. According to an example, the decoupled predictor queue 125 may be formed as a separate hardware queue in the memory controller 119 to store addresses of a variable number of upcoming memory requests, as well as previously served requests. The queue size of the decoupled predictor queue 125 may be scalable. Hardware overhead of the decoupled predictor queue 125 may also be less than hardware overhead of the pending memory request queue 122 with the same number of entries because the decoupled predictor queue 125 stores the addresses of the queue, whereas the memory request queue 122 holds memory access information, such as, addresses, data, and control. Therefore, the decoupled predictor queue 125 includes improved scalability to meet the demands on storing a large number of memory requests to improve prediction accuracy in memory systems with a large number of DRAM banks 114 (e.g., 3D stacked memories).

Since the decoupled predictor queue 125 may be much larger than the pending memory request queue 122, a processor may send memory request information to the predictor queue 125 even if the memory request queue 122 is full. In this case, although the memory request queue 122 may not accept new memory requests that can be issued to external memory, the predictor queue 125 may still be able to accept information on future memory requests for a more forward lookup to improve prediction accuracy on RB cache management. The predictor queue 125 may also track historical memory requests to make further improved decisions on selectively utilizing the RB cache 116 entries. For example, the decoupled predictor queue 125 may first store information for future memory requests and fill any remaining capacity with previously serviced memory requests.

The predictor queue 125 may be implemented in the memory controller 119 for improved performance, or at the 3D DRAM stack side (e.g., the logic die 112) for improved cost efficiency. For systems with limited memory capacity and memory bank count per memory channel that do not need extra information of memory access pattern, the decoupled predictor queue 125 may also be merged with the memory request queue 122.

The fetching module 126 may make selective caching decisions with adaptive granularities based on information stored in the predictor queue 125 and/or the pending memory request queue 122. For example, the fetching module 126 may evaluate a number of memory requests in the predictor queue 125, or in the pending memory request queue 122 if the predictor queue 125 and the pending memory request queue 122 are unified. Alternatively, if the predictor queue 125 and the pending memory request queue 122 are not unified, a decision to evaluate both the predictor queue 125 and the pending memory request queue 122 may be based on whether these queues are exclusive or inclusive. If the queues are inclusive (i.e., the predictor queue 125 is larger than the memory request queue 122 and has all the address information of the memory request queue 122), then the predictor queue 125 is searched. Otherwise, if the queues are exclusive, both the predictor queue 125 and the pending memory request queue 122 may be searched to improve accuracy.

A first decision, whether to cache a DRAM row to the RB cache 116 on the logic die 112, may be made by using policies. For example, the fetching module 126 may make a decision on whether to cache a DRAM row to the RB cache 116 according to memory access pattern. For example, if many upcoming memory requests show high locality and hit on the same row address, the memory row may be cached so that subsequent memory accesses can be served directly from the RB cache. Since accessing the RB cache may be more efficient than directly accessing the memory row, the latency and energy consumption of subsequent memory accesses may be reduced, which in turn improves overall system performance and energy efficiency. Alternatively, when the memory fetching module 126 observes no or few additional pending requests to the same row, the fetching module 126 may skip allocation of an entry of the RB cache and issue read/write requests directly to the internal memory row buffer. When there are few requests to a row, it may be faster to perform a few individual 64-byte memory accesses, including both read and write, than to cache an entire internal memory row buffer (i.e., 8-16 Kb) to the row-buffer cache. The memory status (e.g., bank contention, etc.) tracked by the memory controller 119 may also be used to help determine which row should be cached. For example, a row with frequent access and in a busy bank may be more preferable to be cached than a row in an idle bank with the same access frequency.

If the fetching module 126 is to fetch a DRAM row and cache it in the RB cache 116, the fetching module 126 then makes a second decision as to how much data or what fraction of the DRAM row should be cached. The second decision may be performed by comparing all the memory requests in the predictor queue 125 with the target row address of the outstanding request. For example, assuming that the size of a last-level cache line is 64 Bytes, the fraction of the DRAM row (i.e., how many 64 Byte data blocks) to be fetched and cached may be determined by the longest distance between requested cache lines, including both pending and past requests, in the same row.

For example, since 64-Byte lines are generally cached in a processor and 128-Byte data may also be cached in a processor, by next line prefetching, caching data blocks smaller than 256 Bytes in the RB cache 116 may provide minimal performance gain. Thus, the predictor module 123 may selectively cache data with adaptive granularity from a sub-page of size 256 B to a full-page of the size of an entire DRAM row, in increments of a sub-page. A sub-page may be defined as the smallest unit of the data transaction between the DRAM die 111 and the RB cache 116 when fetching and caching a partial DRAM row. A sub-page size may vary from a CPU cache line size (e.g., 64 B) to the size of the entire row. For each memory request being serviced by a processor, a population count circuit may be used to tally the number of row address matches among the requests in the predictor queue 125 or memory request queue 122 (i.e., if the decoupled predictor queue 125 is merged with the memory request queue 122), and further, all the sub-pages with the same row address as the outstanding memory request may be cached. The final decision made by the fetching module 126 may be sent via the command bus 121 to the rank controllers 115 in the 3D DRAM stack.

Figure 4:
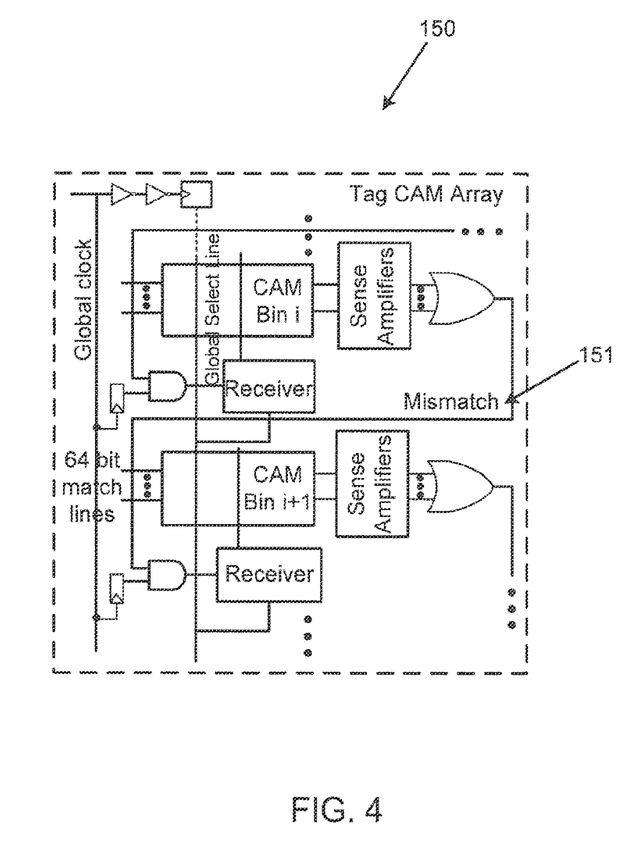
FIG. 4 illustrates a content addressable memory (CAM) design for a tag portion in the row mapping unit, according to an example of the present disclosure.

In order for the AG RB cache 116 to support different access granularities, for example, from a sub-page to a full-page, adjacent sub-pages of a DRAM row may be placed adjacently in the RB cache 116 to provide burst block transfers between the RB cache 116 and the memory stack. Otherwise, evicting a full-page or several sub-pages from the RB cache 116 may result in multiple row buffer activations and precharges that are relatively slow and power-intensive. Partial rows may also be placed as close as possible in the RB cache 116, for example, to eliminate fragmentation. The RB cache 116 may also be fully-associative to avoid conflicts. For example, for a 128 KB sized RB cache 116, the associativity is 512 with access granularity of a 256 B sub-page, and 64 with a 2 KB full-page. Although these aspects may be satisfied by an un-optimized content addressable memory (CAM), the performance and energy overhead may be prohibitively high. To reduce the hardware cost from supporting the highest adaptive associativity, the apparatus 110 may use an efficient and scalable approach as shown in FIG. 4 and described in further detail below.

The RB cache allocation table 124 may be implemented in the processor-side memory controller 119 to accelerate the RB cache 116 hit/miss detection to facilitate tracking of which (partial) rows may be currently stored in the RB cache 116. The memory controller 119 may also consult the RB cache allocation table 124 for command scheduling.

The data array 118 of the RB cache 116 may be placed on the logic layer (i.e., the logic die 112) in the vicinity of the 3D stacked DRAM (i.e., the DRAM die 111), because of the location of the TSV channels 117 for transferring data between the 3D stacked DRAM and the logic die 112. This separate cache configuration is beneficial because DRAM accesses are less latency sensitive than the small caches on processor chips, and the miss rates are typically higher.

Figure 3:
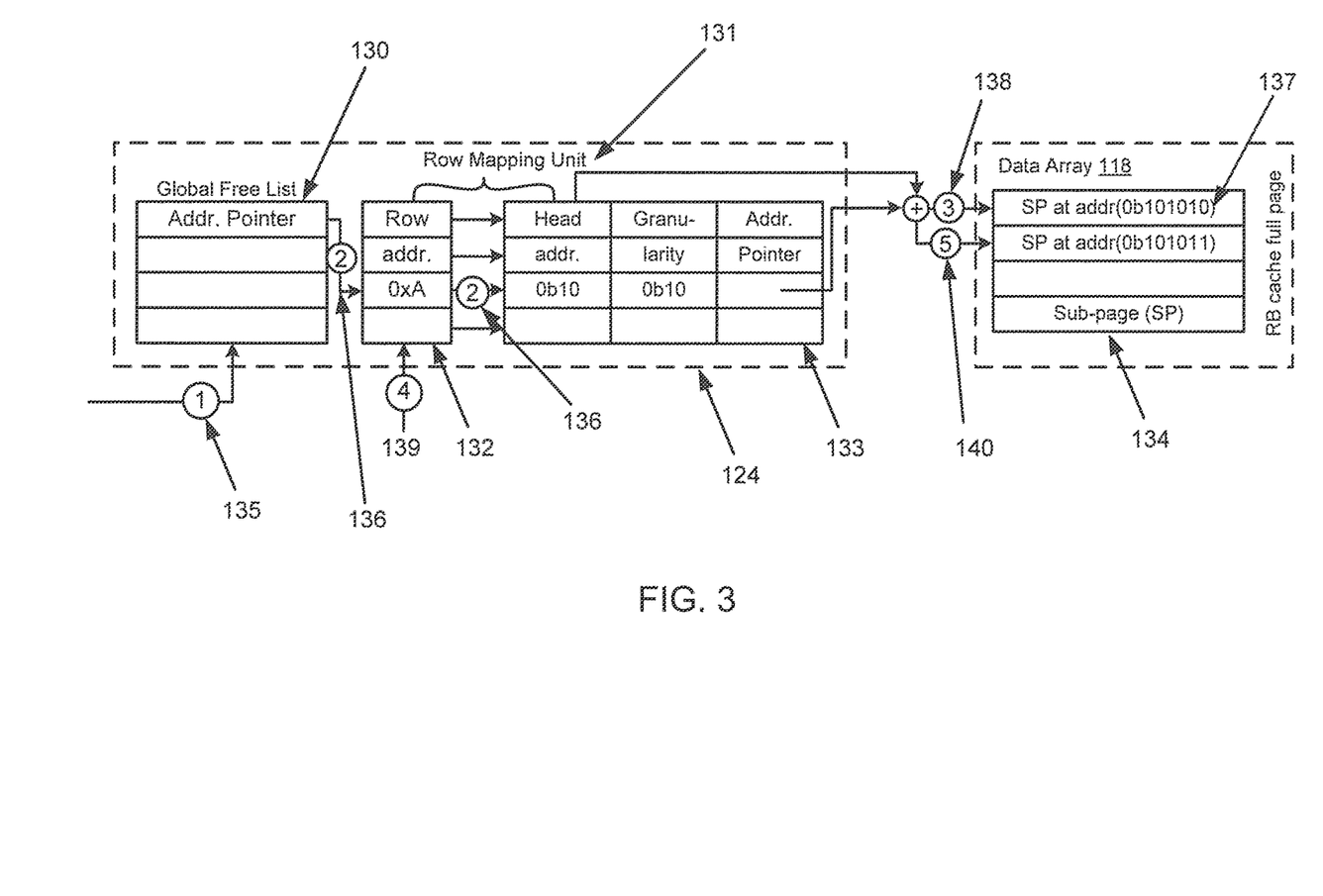
FIG. 3 illustrates an enlarged view of a global free list, a row mapping unit, and a data array for the AG-RB cache apparatus of FIG. 2, and an example flow of partial row caching and a subsequent hit, according to an example of the present disclosure.

Referring to FIGS. 2 and 3, FIG. 3 illustrates an enlarged view of a global free list 130 and a row mapping unit 131 for the AG-RB cache apparatus 110 of FIG. 2, and an example flow of partial row caching and a subsequent hit, according to an example of the present disclosure. The RB cache allocation table 124 may include the global free list 130 and the row mapping unit 131. The global free list 130 may hold the information of the cache lines in the data array 118, and may further map rows in the row mapping unit 131 during cache line install or replacement. The row mapping unit 131 may function as a self-contained fully associative cache. A tag portion 132 may be implemented in the CAM 150 of FIG. 4. The tag portion 132 may store the row addresses of memory blocks for lookup. A data portion 133 may hold the cache line information including head address, granularity, and address pointers to index the data array 118, in addition to cache information such as dirty bit and valid bit (not shown).

According to an example, the data array 118 of the RB cache 116 may be either distributed or centralized on the logic die 112. Compared to a centralized RB cache placement, the distributed RB cache placement may avoid conflicts between DRAM ranks, and avoid the energy overhead of transferring data over long inter-rank data lines. Each of the RB caches 116 may include a separate data array 118 that is shared by the stacked DRAM banks within the rank. Multiple adjacent sub-pages may be bundled to form a cache line with larger granularity up to a full-page. In this process, the subpages may be aligned at the corresponding address boundary of the access granularity. Multiple sub-pages from the same DRAM row may be stored continuously, for example, to avoid multiple evictions to the same row.

Referring to FIG. 4, the tag portion 132 of the row mapping unit 131 may contain a CAM to support fast address lookup. In order to reduce the cost of maintaining high associativity of the RB cache 116 at small granularity (e.g., sub-page), the apparatus 110 may include a CAM 150 for the tag portion 132 of the row mapping unit 131. For the CAM 150, for a hierarchical search line, the storage may be divided into bins (e.g., see CAM bin (i), CAM bin (i+1), etc.), where the mismatch signal at 151 of the previous bin may trigger an access (i.e., comparison) in the next bin. With this partial access configuration of the CAM 150, the latency and power may be significantly reduced compared to repeated full access to the CAM.

The CAM 150 provides for storage of row addresses and offset information to be computed after the row address lookup in tag. For example, since different applications may have certain preferences of memory access granularity, row address tags of certain sub-pages may have a much higher hit rate than that of others. For example, if applications prefer accessing the full-page of 2 KB in a 64-entry RB cache 116 whose sub-page size is 256 B, all tag comparisons may be performed at the corresponding 64 sub-pages (i.e., those are the head of a full-page) out of the total 512 in the data array 118. If all these entries are placed in the first bin of the tag CAM 150 in the row mapping unit 131, the 512-way associative row mapping unit 131 may have comparable power and timing to a 64-entry CAM, while still covering the worst case. The memory controller 119 may monitor the average access granularity and sort the tag portion 132 store by moving the entries with preferred access granularity to upper CAM bins periodically. The time complexity of the hardware-sorted table may be as low as O(n).

With regard to replacement policy for management of the RB cache 116, a cache line may be evicted if there are no future memory requests to it in the memory request queue 122 and/or the predictor queue 125, and it is not mapped to a busy bank. If no lines of the RB cache 116 meet this criteria, the replacement policy may be degraded to a least recently used (LRU) replacement policy.

In order to support adaptive granularity, a cache line may be evicted if it is large enough (i.e., equal to or larger than the size of the pending request) such that a single eviction will make enough room for the new request. Further, a cache line may be evicted such that non-dirty cache lines are preferred over dirty cache lines.

An example of an operation flow in the RB cache 116 is described with reference to FIGS. 2 and 3. At 135 (i.e., step (1)), when the predictor module 123 detects a new (partial) row that needs to be cached, the predictor module 123 sends out requests to the RB cache 116. In this example, it is assumed that a full-page is 1 KB with 4 sub-pages, and the RB cache 116 is to cache a half row (i.e., two sub-pages) with the row address as 0b 1010 and the sub-row address starting at 0b 101010. At 136 (i.e., step (2)), the global free list 130 may pick an available cache line at the 512 B boundary in the data array 118 (e.g., cache line 137) and insert this cache line into the empty entries of the row mapping unit 131. The row address and the meta information may be stored in the tag 132 and data portions 133, respectively, of the row mapping unit 131. The meta information may include the head address of 0b 10 (i.e., the offset of subpage address within the DRAM row), the granularity of 0b 10 (i.e., 2 sub-pages), and the pointer to index the data array cache line. At 138 (i.e., step (3)), the memory controller 119 may issue both a DRAM access command and an RB cache 116 access command to retrieve the data from DRAM and store the half row (i.e., 2 sub-pages with addresses as 0b101010 and 0b101011, respectively) in the data array 118, which completes the memory access and the associated AG-RB cache operation.

Next, a subsequent memory request may arrive. For example, at 139 (i.e., step (4)), with a new memory request accessing data at subpage 0b 101011, the memory controller 119 may consult the RB cache allocation table 124. At 140 (i.e., step (5)), a hit in the row mapping unit 131 indicates that the (partial) row is cached. Since the granularity of the cache row is unknown at this time (i.e., thus it is unknown whether it is a real hit at this stage), the Hamming distance of the address offset (0b 11) of this sub-page requested by the pending memory request and the head address (0b 10) may be compared with the granularity to further confirm whether this is an actual hit. In this example, since the Hamming distance is less than the granularity, this is a real hit, and therefore the starting address of this half row and the Hamming distance may be used together to address the data array 118 for data retrieval.

Figure 5:
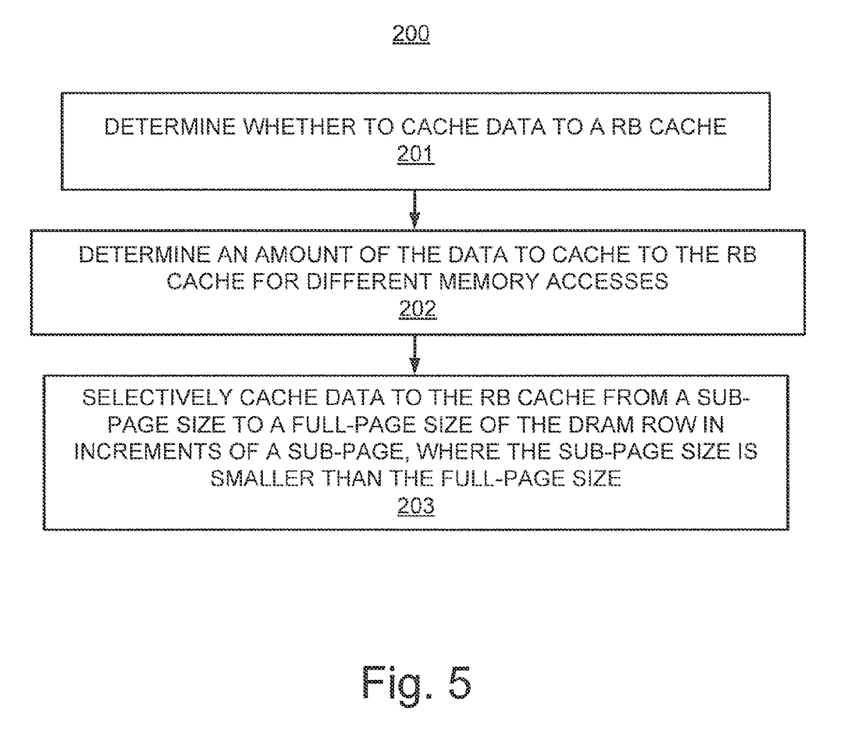
FIG. 5 illustrates a method for adaptive-granularity row buffer caching, according to an example of the present disclosure.

FIG. 5 illustrates a flowchart of a method 200 for AG-RB caching, corresponding to the example of the AG-RB cache apparatus 110 whose construction is described in detail above. The method 200 may be implemented on the AG-RB cache apparatus 110 with reference to FIG. 2 by way of example and not limitation. The method 200 may be practiced in other apparatus.

Referring to FIG. 5, for the method 200, at block 201, a determination is made whether to cache data to a RB cache. Generally, a memory access pattern may be used to determine whether to cache the data to the RB cache. For example, referring to FIG. 2, the fetching module 126 may make selective caching decisions with adaptive granularities based on information stored in the predictor queue 125 and the pending memory request queue 122. A first decision, whether to cache a DRAM row to the RB cache 116 on the logic die 112, may be made by using policies. The predictor queue 125 may be used to store information including addresses of previously served memory requests and upcoming memory requests. The predictor queue 125 may be combinable with the memory request queue 122. The address stored in the predictor queue 125 or information stored in the memory request queue 122 may be used to determine whether to cache the DRAM row to the RB cache 116. The predictor queue 125 may be implemented in the memory controller 119 of the processor (e.g., the processor die 113), or at a memory side.

At block 202, a determination is made of an amount of the data to cache to the RB cache for different memory accesses, such as DRAM accesses. Generally, the memory access pattern may be used to determine what part of the data to cache to the RB cache. For example, referring to FIG. 2, if the fetching module 126 is to fetch a DRAM row and cache it in the RB cache 116, the fetching module 126 then makes a second decision as to how much data or what fraction of the DRAM row should be cached. Memory requests in the predictor queue 125 may be compared with a target row address of an outstanding memory request to determine a fraction of the DRAM row to be cached to the RB cache 116.

At block 203, data may be selectively cached to the RB cache from a sub-page size to a full-page size of the DRAM row in increments of a sub-page, where the sub-page size is smaller than the full-page size. For example, referring to FIG. 2, data may be selectively cached to the RB cache 116 from a sub-page size to a full-page size of the DRAM row in increments of a sub-page. The RB cache allocation table 124 may be used to track DRAM rows that are stored in the RB cache 116, and the data array 118 may be used to store the DRAM row or a fraction of the DRAM row for the RB cache 116. The RB cache allocation table 124 may be implemented in the memory controller 119 of the processor (e.g., the processor die 113) for a 3D stacked DRAM, and the data array 118 may be implemented on the logic layer (e.g., the logic die 112) of the 3D stacked DRAM. A global free list 130 of the RB cache allocation table 124 may be used to hold information related to cache lines in the data array 118, and the global free list 130 may be used to map the DRAM rows in the row mapping unit 131 during cache line install or replacement. The row mapping unit 131 may include the tag portion 132 to store DRAM row addresses of memory blocks for lookup, and the data portion 133 to hold cache line information. The tag portion 132 may use the CAM 150 that includes storage divided into bins, where a mismatch signal of a previous bin triggers an access in a next bin.

Figure 6:
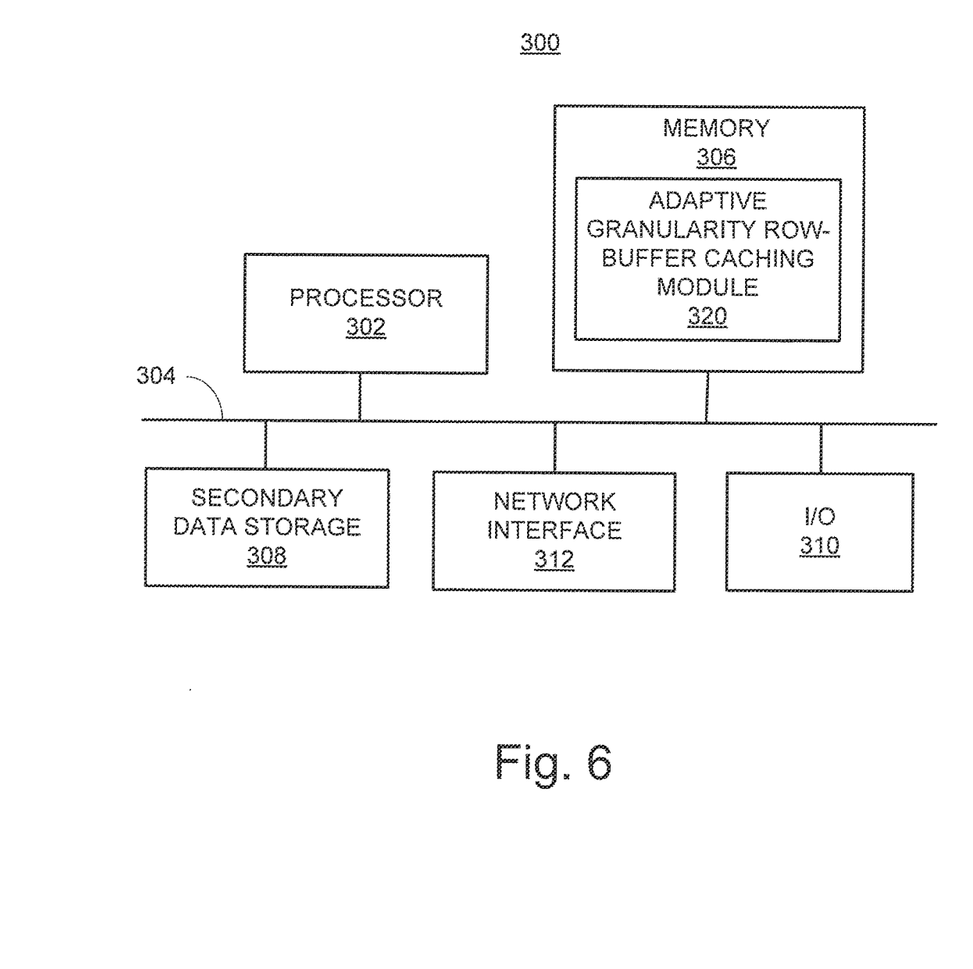
FIG. 6 illustrates a computer system, according to an example of the present disclosure.

FIG. 6 shows a computer system 300 that may be used with the examples described herein. The computer system represents a generic platform that includes components that may be in a server or another computer system. The computer system 300 may be used as a platform for the apparatus 110. The computer system 300 may execute, by a processor or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 300 includes a processor 302 that may implement or execute machine readable instructions performing some or all of the methods, functions and other processes described herein. Commands and data from the processor 302 are communicated over a communication bus 304. The computer system also includes a main memory 306, such as a random access memory (RAM), where the machine readable instructions and data for the processor 302 may reside during runtime, and a secondary data storage 308, which may be non-volatile and stores machine readable instructions and data. The memory and data storage are examples of computer readable mediums. The memory 306 may include an AG-RB caching module 320 including machine readable instructions residing in the memory 306 during runtime and executed by the processor 302. The AG-RB caching module 320 may include the modules of the apparatus shown in FIG. 2.

The computer system 300 may include an I/O device 310, such as a keyboard, a mouse, a display, etc. The computer system may include a network interface 312 for connecting to a network. Other known electronic components may be added or substituted in the computer system.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for adaptive-granularity row buffer (AG-RB) caching comprising:
    determining whether to cache data targeted by a current memory request to a row buffer (RB) cache, wherein the data is stored in a dynamic random-access memory (DRAM) row;
    using a predictor queue to store addresses of previously served memory requests and other pending memory requests scheduled after the current memory request;
    determining a fraction of the DRAM row to cache to the RB cache based on a distance between requested cache lines of the previously served memory requests and the other pending memory requests that have a same target row address as the current memory request; and
    storing the determined fraction of the DRAM row in the RB cache.

2. The method of claim 1, further comprising:
    using a memory access pattern to determine whether to cache the data targeted by the current memory request to the RB cache; and
    using the memory access pattern to further determine what fraction of the DRAM row to cache to the RB cache.

3. The method of claim 1, comprising determining the fraction of the DRAM row to cache to the RB cache according to the longest distance between requested cache lines of the previously served memory requests and the other pending memory requests that have the same target row address as the current memory request.

4. The method of claim 1, further comprising determining to evict a portion of the RB cache in servicing a different memory request, wherein determining comprises:
    evicting the fraction of the DRAM row cached to the RB cache responsive to a determination that the fraction of the DRAM row is equal to or larger than a data size requested for the different memory request; and
    evicting a different portion of the RB cache instead of the fraction of the DRAM row responsive to a determination that the fraction of the DRAM row is less than the data size requested for the different memory request.

5. The method of claim 1, further comprising:
    caching the fraction of the DRAM row to the RB cache with a data size from a sub-page size to a full-page size of the DRAM row in increments of a sub-page, wherein the sub-page size is smaller than the full-page size.

6. The method of claim 1, further comprising:
    using a RB cache allocation table to track DRAM rows that are stored in the RB cache; and
    using a data array to store the DRAM row or a fraction of the DRAM row for the RB cache.

7. The method of claim 6, further comprising:
    implementing the RB cache allocation table in a memory controller of the processor for a three-dimensional (3D) stacked DRAM; and
    implementing the data array on the logic layer of the 3D stacked DRAM.

8. The method of claim 6, further comprising:
    using a global free list of the RB cache allocation table to hold information related to cache lines in the data array; and using the global free list to map the DRAM rows in a row mapping unit during cache line install or replacement.

9. The method of claim 6, further comprising:
using a row mapping unit including:
a tag portion to store DRAM row addresses of memory blocks for lookup, and
a data portion to hold cache line information.

10. The method of claim 6, further comprising:
using a row mapping unit including a tag portion to store DRAM row addresses of memory blocks for lookup, wherein the tag portion uses a content addressable memory (CAM) that includes storage divided into bins, wherein a mismatch signal of a previous bin triggers an access in a next bin.

11. The method of claim 1, further comprising:
implementing the RB cache using a dual in-line memory module (DIMM) with an on-board buffer chip.

12. An adaptive-granularity row buffer (AG-RB) cache apparatus comprising:
a three-dimensional (3D) stacked dynamic random-access memory (DRAM) including:
a plurality of DRAM dies including at least one DRAM bank, and
a logic die including at least one row buffer (RB) cache; and
a processor die including a memory controller including: predictor hardware to:
determine whether to cache data targeted by a current memory request to the RB cache, wherein the data is stored in a DRAM row of the DRAM bank;
use a predictor queue that stores addresses of previously served memory requests and other pending memory requests scheduled after the current memory request;
determine a fraction of the DRAM row to cache to the RB cache based on a distance between requested cache lines of the previously served memory requests and the other pending memory requests that have a same target row address as the current memory request; and
store metadata for the fraction of the DRAM row cached to the RB cache, wherein the metadata includes a granularity corresponding to a data size of the fraction of the DRAM row.

13. The AG-RB cache apparatus of claim 12, wherein the predictor hardware is to determine the fraction of the DRAM row to cache to the RB cache according to the longest distance between requested cache lines of the previously served memory requests and the other pending memory requests that have the same target row address as the current memory request.

14. The AG-RB cache apparatus of claim 12, wherein the predictor hardware is to determine the fraction of the DRAM row in increments of subpages and wherein the granularity specifies a number of sub-pages of the DRAM row that is cached to the RB cache.

15. The AG-RB cache apparatus of claim 12, wherein the predictor hardware is further to store metadata that includes head address metadata that specifies an offset in the DRAM row at which cached data starts.

16. The AG-RB cache apparatus of claim 15, wherein the memory controller is to determine whether the RB cache stores data targeted by a subsequent memory request by:
determining the subsequent memory request targets the DRAM row;
determining a sub-page offset specified in the subsequent memory request; and
identifying a cache hit or a cache miss based on the comparing the sub-page offset, the head address metadata, and the granularity.

17. The AG-RB cache apparatus of claim 16, wherein the memory controller is to identify the cache hit or the cache miss by:
responsive to a determination that a hamming distance between the sub-page offset specified in the subsequent memory request and the head address metadata stored for the DRAM row is less than or equal to the granularity:
identifying the cache hit in the RB cache and retrieving the data targeted by the subsequent memory address from the RB-cache; and
responsive to a determination that the hamming distance between the sub-page offset specified in the subsequent memory request and the head address metadata stored for the DRAM row is greater than the granularity:
identifying the cache miss.

18. A memory apparatus comprising:
a three-dimensional (3D) stacked dynamic random-access memory (DRAM) including:
a plurality of DRAM dies including at least one DRAM bank, and
a logic die including at least one row buffer (RB) cache; and
a processor die including a memory controller including:
a predictor queue to store addresses of previously served memory requests and other pending memory requests scheduled after a current memory request;
predictor hardware to:
determine whether to cache data targeted by the current memory request to the RB cache, wherein the data is stored in a DRAM row of the DRAM bank;
determine a fraction of the DRAM row to cache to the RB cache based on a distance between requested cache lines of the previously served memory requests and the other pending memory requests that have a same target row address as the current memory request; and
store metadata for the fraction of the DRAM row cached to the RB cache, wherein the metadata includes a granularity corresponding to a data size of the fraction of the DRAM row and head address metadata that specifies an offset in the DRAM row at which cached data starts.

19. The memory apparatus of claim 18, wherein the predictor hardware is to determine the fraction of the DRAM row to cache to the RB cache according to the longest distance between requested cache lines of the previously served memory requests and the other pending memory requests that have the same target row address as the current memory request.

20. The memory apparatus of claim 18, wherein the memory controller is to determine to evict a portion of the RB cache in servicing a different memory request, including:
evicting the fraction of the DRAM row cached to the RB cache responsive to a determination that the fraction of the DRAM row is equal to or larger than a data size requested for the different memory request; and
evicting a different portion of the RB cache instead of the fraction of the DRAM row responsive to a determination that the fraction of the DRAM row is less than the data size requested for the different memory request.

* * * * *